United States Patent
Chen

(10) Patent No.: US 9,269,602 B2
(45) Date of Patent: Feb. 23, 2016

(54) FABRICATION METHOD OF WAFER LEVEL SEMICONDUCTOR PACKAGE AND FABRICATION METHOD OF WAFER LEVEL PACKAGING SUBSTRATE

(71) Applicant: Siliconware Precision Industries Co., Ltd., Taichung (TW)

(72) Inventor: Lu-Yi Chen, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 27 days.

(21) Appl. No.: 13/628,582

(22) Filed: Sep. 27, 2012

(65) Prior Publication Data

US 2013/0252383 A1 Sep. 26, 2013

(30) Foreign Application Priority Data

Mar. 21, 2012 (TW) .............................. 101109611 A

(51) Int. Cl.
*H01L 21/00* (2006.01)
*H01L 21/683* (2006.01)
(Continued)

(52) U.S. Cl.
CPC ........ *H01L 21/6835* (2013.01); *H01L 21/4857* (2013.01); *H01L 23/49822* (2013.01); *H01L 24/97* (2013.01); *H01L 21/563* (2013.01); *H01L 21/568* (2013.01); *H01L 22/14* (2013.01); *H01L 22/20* (2013.01); *H01L 23/3128* (2013.01); *H01L 23/3185* (2013.01); *H01L 23/49816* (2013.01); *H01L 24/11* (2013.01); *H01L 24/13* (2013.01); *H01L 24/16* (2013.01); *H01L 24/81* (2013.01); *H01L 25/0657* (2013.01); *H01L 2221/68345* (2013.01); *H01L 2221/68359* (2013.01); *H01L 2221/68381* (2013.01); *H01L 2224/11849* (2013.01); *H01L 2224/131* (2013.01); *H01L 2224/133* (2013.01); *H01L 2224/1319* (2013.01); *H01L 2224/1329* (2013.01); *H01L 2224/13082* (2013.01); *H01L 2224/16225* (2013.01); *H01L 2224/16227* (2013.01); *H01L 2224/32225* (2013.01); *H01L 2224/73204* (2013.01);
(Continued)

(58) Field of Classification Search
CPC ............ H01L 2224/32225; H01L 2224/73265
See application file for complete search history.

(56) References Cited

U.S. PATENT DOCUMENTS 6,452,265 B1 9/2002 Furukawa et al.
7,202,107 B2 4/2007 Fuergut et al.
(Continued)

*Primary Examiner* — Zandra Smith
*Assistant Examiner* — Andre' C Stevenson
(74) *Attorney, Agent, or Firm* — Mintz Levin Cohn Ferris Glovsky and Popeo, P.C.; Peter F. Corless; Steven M. Jensen

(57) ABSTRACT

A fabrication method of a wafer level semiconductor package includes: forming on a carrier a first dielectric layer having first openings exposing portions of the carrier; forming a circuit layer on the first dielectric layer, a portion of the circuit layer being formed in the first openings; forming on the first dielectric layer and the circuit layer a second dielectric layer having second openings exposing portions of the circuit layer; forming conductive bumps in the second openings; mounting a semiconductor component on the conductive bumps; forming an encapsulant for encapsulating the semiconductor component; and removing the carrier to expose the circuit layer. By detecting the yield rate of the circuit layer before mounting the semiconductor component, the invention avoids discarding good semiconductor components together with packages as occurs in the prior art, thereby saving the fabrication cost and improving the product yield.

20 Claims, 6 Drawing Sheets

(51) Int. Cl.
*H01L 21/48* (2006.01)
*H01L 23/31* (2006.01)
*H01L 23/498* (2006.01)
*H01L 21/56* (2006.01)
*H01L 23/00* (2006.01)
*H01L 25/065* (2006.01)
*H01L 21/66* (2006.01)

(52) U.S. Cl.
CPC ............. *H01L2224/81005* (2013.01); *H01L 2224/81193* (2013.01); *H01L 2224/81815* (2013.01); *H01L 2224/97* (2013.01); *H01L 2225/06517* (2013.01); *H01L 2924/15311* (2013.01); *H01L 2924/18161* (2013.01)

(56) References Cited

U.S. PATENT DOCUMENTS

| | | | |
|---|---|---|---|
| 8,176,628 B1* | 5/2012 | Rusli et al. | 29/852 |
| 8,368,173 B2* | 2/2013 | Chen | H01L 21/76898 257/277 |
| 2003/0153122 A1* | 8/2003 | Brooks | 438/107 |
| 2008/0029894 A1* | 2/2008 | Wang | H01L 23/49822 257/762 |
| 2008/0164573 A1* | 7/2008 | Basker et al. | 257/621 |
| 2009/0014865 A1* | 1/2009 | Chou | H01L 23/3677 257/712 |
| 2011/0221054 A1* | 9/2011 | Lin | H01L 21/568 257/692 |
| 2012/0146216 A1* | 6/2012 | Kang et al. | 257/737 |
| 2012/0313147 A1* | 12/2012 | Anderson et al. | 257/204 |

* cited by examiner

FIG.2H"

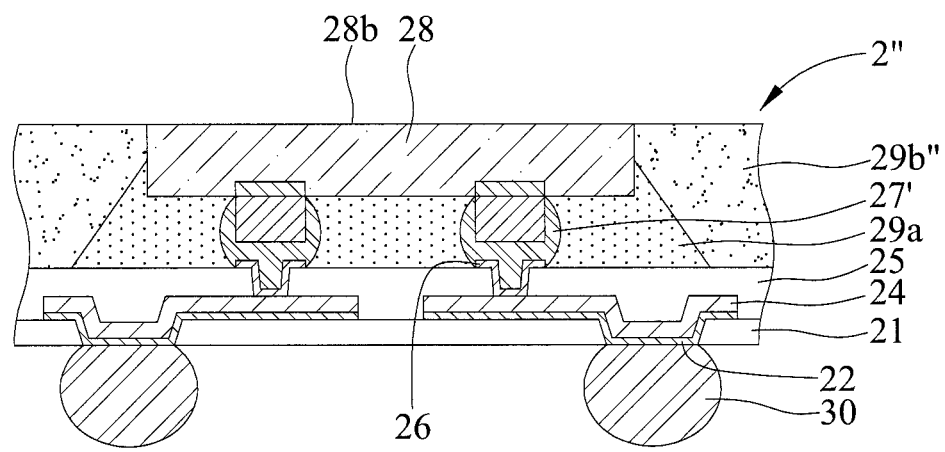
FIG.2K"

FABRICATION METHOD OF WAFER LEVEL SEMICONDUCTOR PACKAGE AND FABRICATION METHOD OF WAFER LEVEL PACKAGING SUBSTRATE

CROSS-REFERENCES TO RELATED APPLICATIONS

This application claims under 35 U.S.C. §119(a) the benefit of Taiwanese Application No. 101109611, filed Mar. 21, 2012, the entire contents of which is incorporated herein by reference.

BACKGROUND OF THE INVENTION

1. Field of the Invention

The present invention relates to fabrication methods of semiconductor packages, and more particularly, to a fabrication method of a wafer level semiconductor package and a fabrication method of a wafer level packaging substrate for improving the product accuracy.

2. Description of Related Art

Along with the rapid development of electronic industries, electronic products are developed towards multi-function and high performance. To meet the miniaturization requirement of semiconductor packages, wafer level packaging (WLP) technologies have been developed.

U.S. Pat. No. 6,452,265 and U.S. Pat. No. 7,202,107 provide fabrication methods of wafer-level packages. FIGS. 1A to 1E are schematic cross-sectional views showing a fabrication method of a conventional wafer level semiconductor package 1.

Referring to FIG. 1A, a thermal release tape 11 is formed on a carrier 10.

Referring to FIG. 1B, a plurality of semiconductor components 12 are disposed on the thermal release tape 11. Each of the semiconductor components 12 has an active surface 12a with a plurality of electrode pads 120 and an inactive surface 12b opposite to the active surface 12a. Each of the semiconductor components 12 is disposed on the thermal release tape 11 via the active surface 12a thereof.

Referring to FIG. 1C, an encapsulant 13 is formed on the semiconductor components 12 and the thermal release tape 11 through molding.

Referring to FIG. 1D, the thermal release tape 11 and the carrier 10 are removed to expose the active surfaces 12a of the semiconductor components 12.

Referring to FIG. 1E, by performing a redistribution layer (RDL) process and a bump process, a circuit structure 14 is formed on the encapsulant 13 and the active surfaces 12a of the semiconductor components 12 and electrically connecting the electrode pads 120 of the semiconductor components 12.

However, since the thermal release tape 11 is flexible, the positioning accuracy of the semiconductor components 12 is adversely affected by the CTE (Coefficient of Thermal Expansion) of the thermal release tape 11 and lateral forces applied on the thermal release tape 11 by the encapsulant 13 during the molding process. Therefore, an increase in the size of carrier 10 results in an increase in the position error of the semiconductor components 12, thereby causing yield losses in the RDL and bump processes.

Furthermore, since the above-described method forms the encapsulant 13 before performing the RDL process, if it is detected that the circuit structure 14 is of low quality during a subsequent test, the overall semiconductor package 1 has to be discarded. That is, good semiconductor components 12 are also discarded, thus resulting in a high fabrication cost. Therefore, the above-described method is not economic.

Therefore, how to overcome the above-described drawbacks has become critical.

SUMMARY OF THE INVENTION

The present invention provides a fabrication method of a wafer level packaging substrate, which comprises the steps of: forming on a carrier a first dielectric layer having a plurality of first openings for exposing portions of the carrier; forming a circuit layer on the first dielectric layer, a portion of the circuit layer being formed in the first openings of the first dielectric layer; forming on the first dielectric layer and the circuit layer a second dielectric layer having a plurality of second openings for exposing portions of the circuit layer; and forming a plurality of conductive bumps on the exposed portions of the circuit layer in the second openings and electrically connected to the circuit layer.

The above-described method further comprises removing the carrier to expose the circuit layer.

The present invention further provides a fabrication method of a wafer level semiconductor package, which comprises the steps of: providing a carrier for carrying a packaging substrate, wherein the packaging substrate comprises a first dielectric layer formed on the carrier, a circuit layer formed on the first dielectric layer, a second dielectric layer formed on the first dielectric layer, and a plurality of conductive bumps disposed on the second dielectric layer and electrically connected to the circuit layer; providing a semiconductor component having an active surface and an inactive surface opposite to the active surface and mounting the semiconductor component on the packaging substrate and electrically connecting the semiconductor component to the conductive bumps; forming an encapsulant on the second dielectric layer for encapsulating the semiconductor component; and removing the carrier to expose the circuit layer.

In the above-described fabrication method of a semiconductor package, the active surface of the semiconductor component can have a plurality of conductive portions. By performing a dispensing process or a reflow process, the conductive portions can be electrically connected to the conductive bumps through an adhesive material or a solder material.

In the above-described fabrication method of a semiconductor package, the semiconductor component can be a single chip or a chip stack structure.

In the above-described fabrication method of a semiconductor package, the inactive surface of the semiconductor component can be exposed from the encapsulant.

The above-described fabrication method of a semiconductor package can further comprise grinding the encapsulant so as to thin the thickness of the encapsulant.

Before forming the encapsulant, the above-described fabrication method of a semiconductor package can further comprise forming an underfill between the semiconductor component and the second dielectric layer.

The above-described fabrication method of a semiconductor package can further comprise performing a singulation process.

In the above-described fabrication methods of a packaging substrate and a semiconductor package, the first and second dielectric layers can be made of polyimide (PI), benezocyclobutene (BCB), polybenzoxazole (PBO), silicon dioxide or silicon nitride.

In the above-described fabrication methods, the carrier can be a silicon wafer, a glass plate, a plate with an aluminum layer formed thereon, a silicon wafer with an aluminum layer formed thereon or an aluminum plate. Preferably, the carrier can be a silicon wafer with an aluminum layer formed thereon.

In the above-described fabrication methods, the fabrication of the circuit layer can comprise the steps of: forming a first metal layer on a surface of the first dielectric layer, a portion of the first metal layer being formed in the first openings of the first dielectric layer; forming a resist layer on the first metal layer and forming a plurality of openings in the resist layer for exposing portions of the first metal layer; forming the circuit layer on the exposed portions of the first metal layer in the openings of the resist layer; and removing the resist layer and the first metal layer under the resist layer.

In the above-described fabrication methods, the fabrication of the conductive bumps can comprise the steps of: forming a second metal layer on a of the second dielectric layer, a portion of the second metal layer being formed in the second openings of the second dielectric layer; forming a resist layer on the second metal layer and forming a plurality of openings in the resist layer for exposing portions of the second metal layer; forming the conductive bumps on the exposed portions of the second metal layer in the openings of the resist layer; and removing the resist layer and the second metal layer under the resist layer.

In the above-described methods, the conductive bumps can be made of a solder material and reflowed.

The above-described methods can further comprise forming a redistribution layer structure between the first dielectric layer and the second dielectric layer for electrically connecting the circuit layer and the conductive bumps.

In the above-described methods, the carrier can be removed through a grinding process or an etching process.

After removing the carrier, the above-described methods can further comprise forming conductive elements on the circuit layer.

Therefore, the present invention forms the circuit layer before removing the carrier so as to avoid performing an RDL process after removing the carrier, thus preventing the positioning accuracy of semiconductor components from being adversely affected by the CTE and flexibility of a thermal release tape as in the prior art. Therefore, an increase in the size of the carrier does not result in an increase in the position error of the semiconductor components, thereby facilitating accurate control of the position of the semiconductor components.

Further, the present invention can detect the yield rate of the circuit layer before mounting semiconductor components. If the circuit layer is detected to be of low quality, the structure is directly discarded without performing subsequent processes such as mounting semiconductor components. Therefore, the present invention does not discard good semiconductor components as in the prior art when the circuit layer is detected to be of low quality, thereby saving material costs and achieving cost efficiency.

BRIEF DESCRIPTION OF DRAWINGS

FIGS. 2A to 2H' are schematic cross-sectional views showing a wafer level packaging substrate according to the present invention, wherein FIG. 2H" shows another embodiment of FIG. 2H'.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'on', 'a' etc. are only used as a matter of descriptive convenience and not intended to have any other significance or provide limitations for the present invention.

FIGS. 2A to 2K are schematic cross-sectional views showing a fabrication method of a wafer level semiconductor package 2 according to the present invention.

Figure 1A:
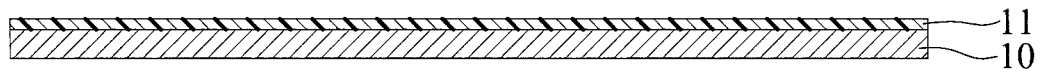
FIGS. 1A to 1E are schematic cross-sectional views showing a fabrication method of a conventional wafer level semiconductor package.
Figure 1B:
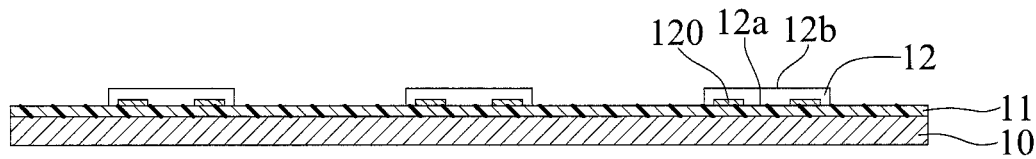
Figure 1C:
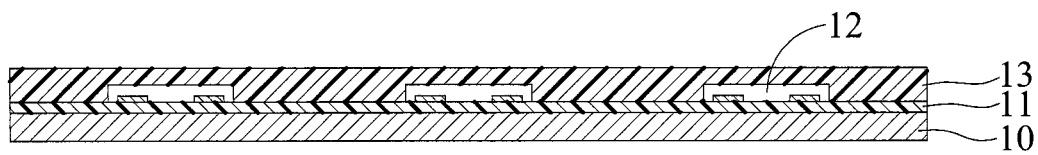
Figure 1D:
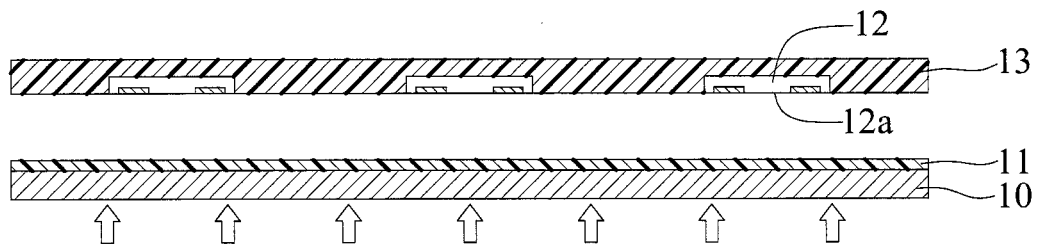
Figure 1E:
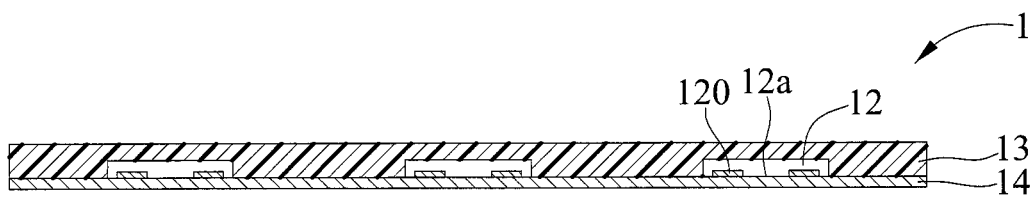
Figure 2A:
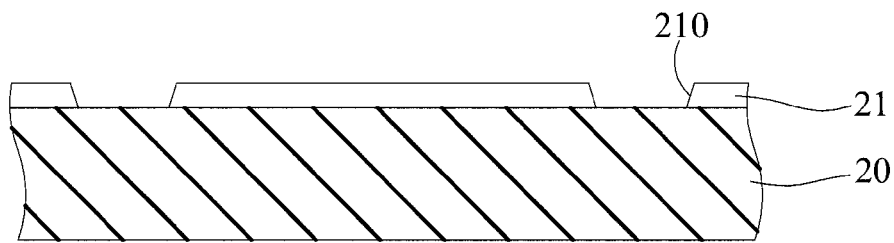
FIGS. 2A to 2K are schematic cross-sectional views showing a fabrication method of a wafer level semiconductor package according to the present invention, wherein FIG. 2G' shows another embodiment of FIG. 2G, and FIGS. 2K' and 2K" show different embodiments of FIG. 2K.

Referring to FIG. 2A, a first dielectric layer 21 is formed on a carrier 20 by coating, and further patterned such that a plurality of openings 210 are formed in the first dielectric layer 21 for exposing portions of the carrier 20.

In the present embodiment, the first dielectric layer 21 can be made of polyimide (PI), benezocyclobutene (BCB) or polybenzoxazole (PBO). The carrier 20 can be a silicon wafer, a glass plate, a plate with an aluminum layer formed thereon, a silicon wafer with an aluminum layer formed thereon or an aluminum plate. Preferably, the carrier 20 is a silicon wafer with an aluminum layer sputtered thereon. It should be noted that the carrier 20 is not limited to the above-described materials. Instead, the carrier 20 can be made of any rigid material.

Figure 2B:
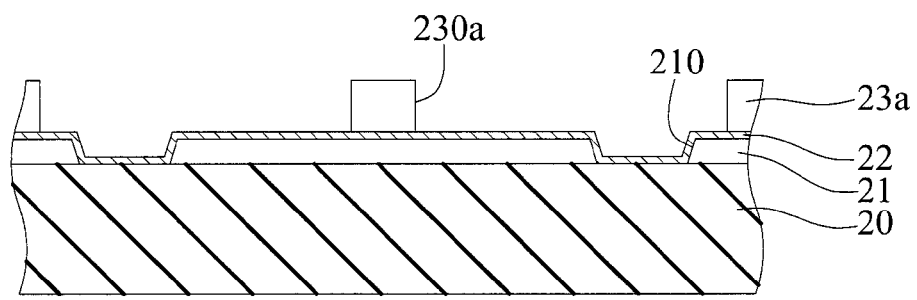

Referring to FIG. 2B, a first metal layer 22 is formed on a surface of the first dielectric layer 21 by sputtering. A portion of the first metal layer 22 is formed in the first openings 210 of the first dielectric layer 21.

Then, a resist layer 23a such as photoresist is formed on the first metal layer 22 by coating, and further patterned through exposure and development such that a plurality of openings 230a are formed in the resist layer 23a for exposing portions of the first metal layer 22 in the first openings 210 and on the first dielectric layer 21.

In the present embodiment, the first metal layer 22 can be used a seed layer for electroplating, and the first metal layer 22 can be made of, but not limited to, Ti, Cu, Ni, V, Al, W, Au or a combination thereof.

Figure 2C:
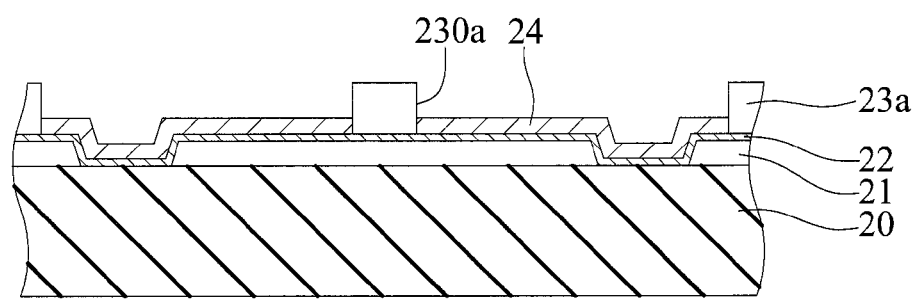

Referring to FIG. 2C, a circuit layer 24 is formed on the exposed portions of the first metal layer 22 by using the first metal layer 22 as a current conductive path.

In the present embodiment, the circuit layer 24 can be made of, but not limited to, Cu or Al.

Figure 2D:
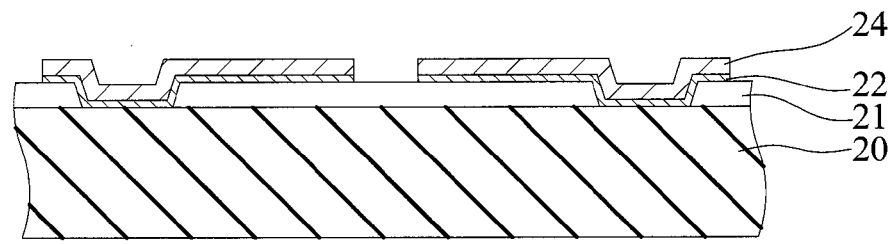

Referring to FIG. 2D, the resist layer 23a is stripped and the first metal layer 22 under the resist layer 23a is removed by etching.

Figure 2E:
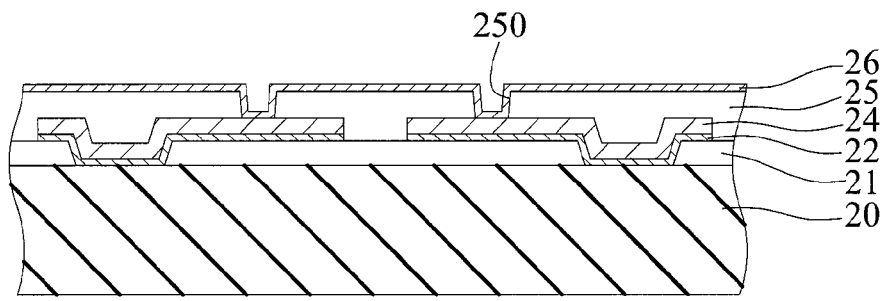

Referring to FIG. 2E, a second dielectric layer 25 is formed on the first dielectric layer 21 and the circuit layer 24 by coating, and patterned through exposure and development such that a plurality of second openings 250 are formed in the second dielectric layer 25 for exposing portions of the circuit layer 24.

Then, a second metal layer 26 is formed on a surface of the second dielectric layer 25 by sputtering. A portion of the second metal layer 26 is formed in the second openings 250 of the second dielectric layer 25.

In the present embodiment, the second dielectric layer 25 can be made of polyimide (PI), benezocyclobutene (BCB) or polybenzoxazole (PBO). The second metal layer 26 can be made of, but not limited to, Ti, Cu, Ni, V, Al, W, Au or a combination thereof.

Figure 2F:
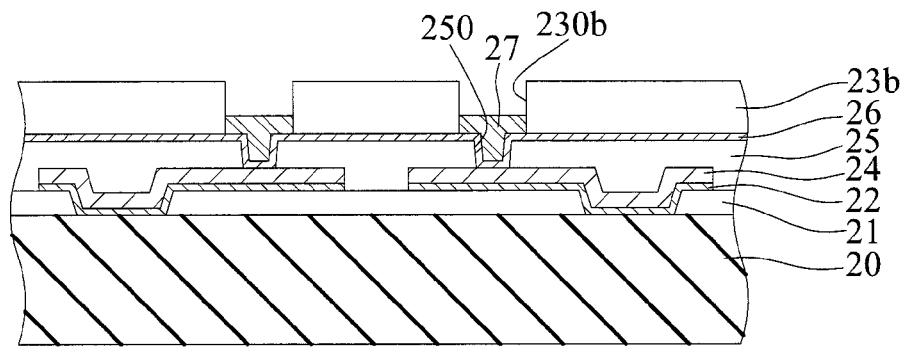

Referring to FIG. 2F, another resist layer 23b such as photoresist is formed on the second metal layer 26 by coating, and further patterned through exposure and development such that a plurality of openings 230b are formed in the resist layer 23b for exposing portions of the second metal layer 26 in and around the second openings 250.

Then, by performing an electroplating process that uses the second metal layer 26 as a current conductive path, a plurality of conductive bumps 27 are formed on the exposed portions of the second metal layer 26 for electrically connecting the circuit layer 24.

In the present embodiment, the conductive bumps 27 can be made of, but not limited to, a solder material, such as a Sn—Ag lead-free solder material. The solder material can also contain Cu, Ni or Ge. The second metal layer 26 can serve as a UBM (Under Bump Metallurgy) layer.

Figure 2G:
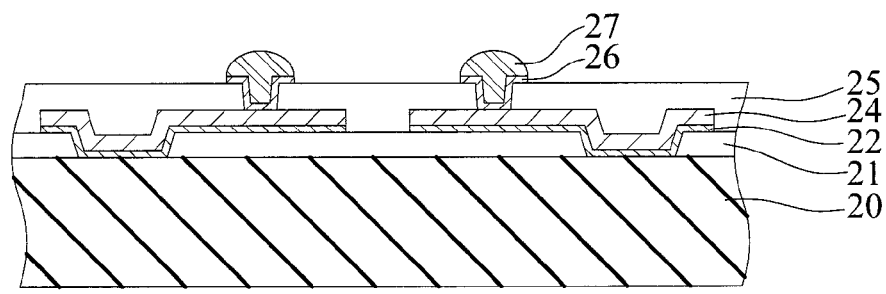
Figure 2G:
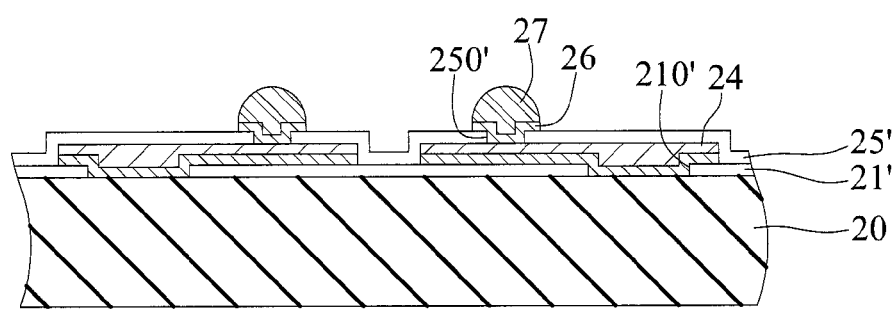

Referring to FIG. 2G, the resist layer 23b is stripped and the second metal layer 26 under the resist layer 23b is removed by etching. Then, the conductive bumps 27 are reflowed.

Referring to FIG. 2G', in another embodiment, the first and second dielectric layers 21', 25' can be made of silicon dioxide ($SiO_2$) or silicon nitride, and formed through PECVD (Plasma-Enhanced Chemical Vapor Deposition). Further, the first and second openings 210', 250' are formed through dry etching.

If the carrier 20 is an aluminum plate or a silicon wafer having an aluminum layer sputtered thereon, an electrical test can be performed to obtain the yield rate of the circuit layer 24 and the conductive bumps 27. If it is detected that the circuit layer 24 and the conductive bumps 27 are of low quality, the overall structure, i.e., the carrier 20 and the structure thereon, is discarded without performing subsequent die mounting and packaging processes, thereby effectively controlling the quality of the structure and avoid discarding good semiconductor components.

Figure 2H:
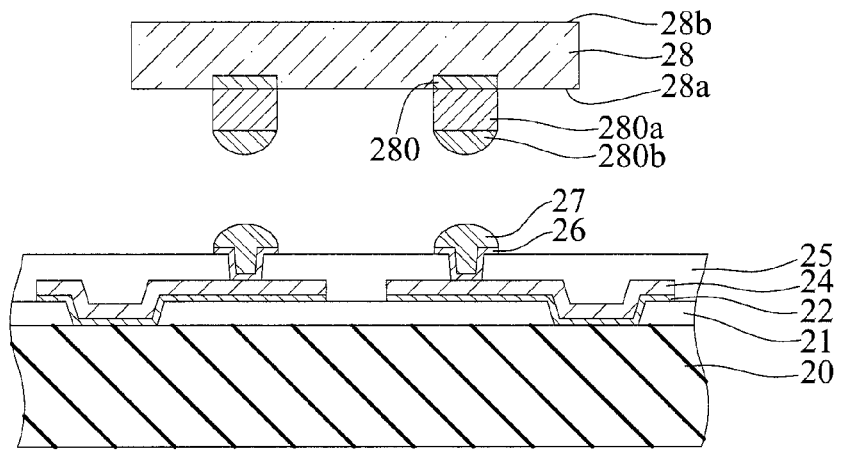
Figure 2H:
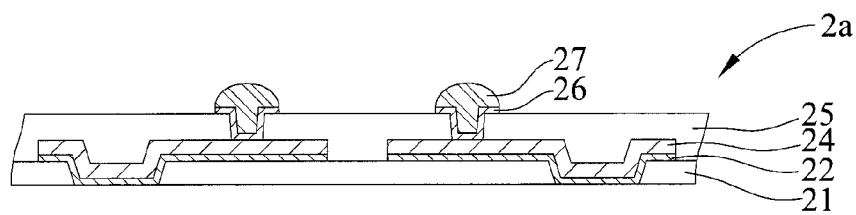

Referring to FIG. 2H, continued from FIG. 2G, a semiconductor component 28 is mounted on the conductive bumps 27. The semiconductor component 28 has an active surface 28a and an inactive surface 28b opposite to the active surface 28a, and the semiconductor component 28 is mounted on the conductive bumps 27 via the active surface 28a thereof.

Figure 2I:
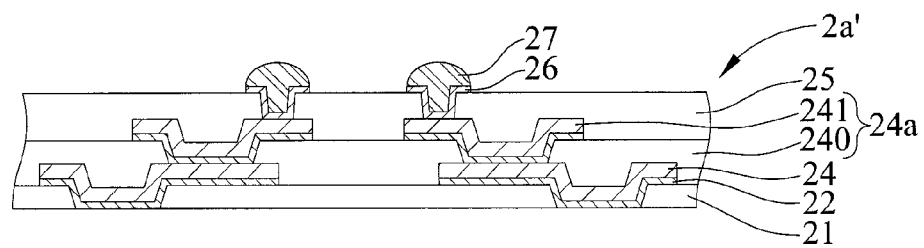
Figure 2I:
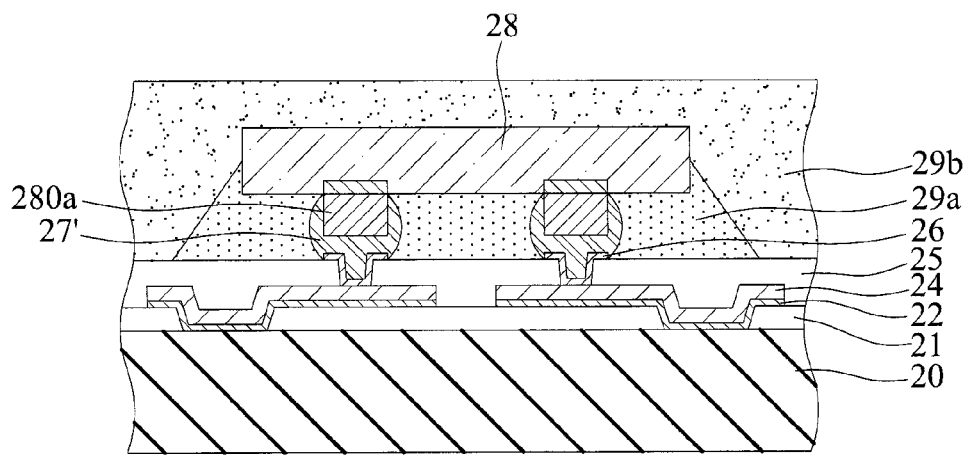

In the present embodiment, the semiconductor component 28 has a plurality of electrode pads 280 bonding with copper conductive portions 280a, respectively. Further, a solder material or an adhesive material 280b, such as a non conductive paste (NCP) or an anisotropic conductive film (ACF), can be selectively formed on the conductive portions 280a. By performing a reflow process or a dispensing process, the conductive portions 280a are accurately aligned and electrically connected to the conductive bumps 27 so as to form solder joints 27', thereby securing the semiconductor component 28 to the second dielectric layer 25, as shown in FIG. 2I.

In the present embodiment, the semiconductor component 28 is a single chip. In other embodiments, the semiconductor component 28 can be a chip stack structure.

Referring to FIG. 2H', continued from FIG. 2G, the carrier 20 is removed to expose the first metal layer 22, thereby forming a wafer level packaging substrate 2a. If the carrier 20 is a silicon wafer, a grinding process can be performed first so as to reduce the thickness of the carrier 20 to a certain value and then a dry etching process and a chemical mechanical polishing (CMP) process are performed to remove the remaining portion of the carrier 20.

In another embodiment, referring to FIG. 2H''', continued from FIG. 2D, a redistribution layer structure 24a is formed on the first dielectric layer 21 and the circuit layer 24 and a second dielectric layer 25 is further formed on the redistribution layer structure 24a.

In the present embodiment, the redistribution layer structure 24a has at least a dielectric layer 240, a circuit layer 241 formed on the dielectric layer 240 for electrically connecting the circuit layer 24 and the conductive bumps 27.

Referring to FIG. 2I, continued from FIG. 2H, an underfill 29a is disposed between the semiconductor component 28 and the second dielectric layer 25, and an encapsulant 29b is formed on the second dielectric layer 25 to encapsulate the semiconductor component 28 and the underfill 29a.

Figure 2J:
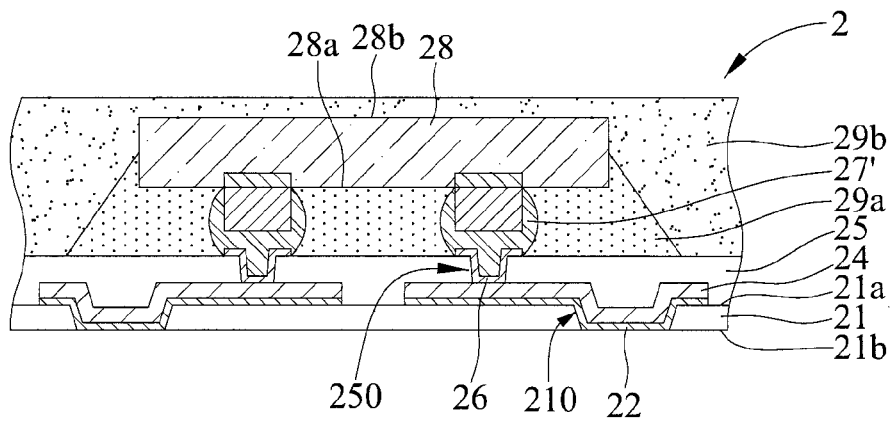

Referring to FIG. 2J, the encapsulant 29b is ground to reduce its thickness.

Thereafter, the carrier 20 is removed to expose the first metal layer 22. For example, if the carrier 20 is a silicon wafer, a grinding process is performed first so as to reduce the thickness of the carrier 20 to a certain value, and then a dry etching process and a CMP process are performed to remove the remaining portion of the carrier 20.

Figure 2K:
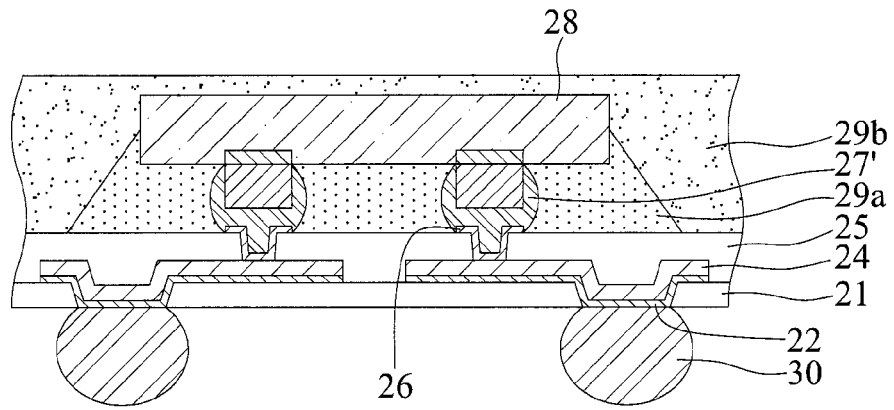
Figure 2K:
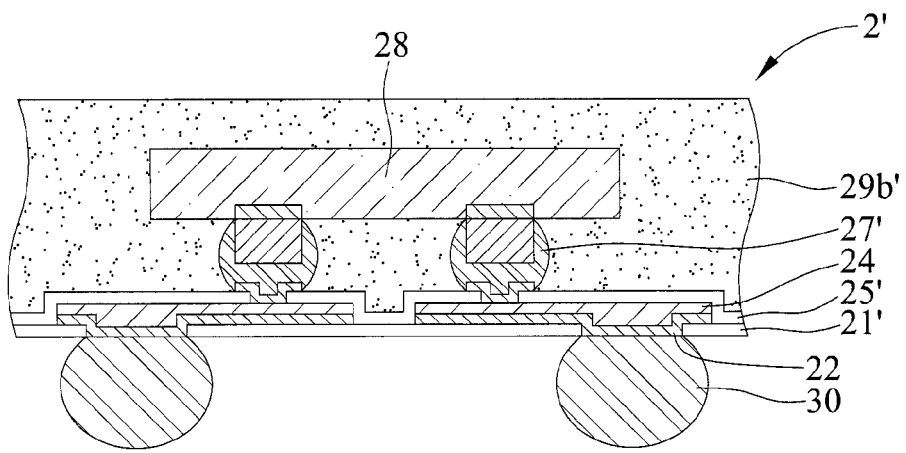

Referring to FIG. 2K, a plurality of conductive elements 30 are disposed on the first metal layer 22 such that the first metal layer 22 serves as a UBM layer. Then, a singulation process is performed.

In the present embodiment, the conductive elements 30 can be, but not limited to, solder balls, conductive bumps or conductive pins.

Referring to FIG. 2K', if the process is continued from FIG. 2G', a semiconductor package 2' is obtained.

If the process is continued from FIG. 2H''', a semiconductor package having the redistribution layer structure 24a is obtained.

Further, referring to FIG. 2K', in order to overcome the void problem during a molding process, the underfill 29a can be omitted such that an encapsulant 29b' is formed through the molding process. Furthermore, through a grinding process, the top surface of the encapsulant 29b' can be flush with the inactive surface 28b of the semiconductor component 28 such that the inactive surface 28b of the semiconductor component 28 is exposed from the encapsulant 29b', thereby improving the heat dissipating effect.

Therefore, by forming the circuit layer 24 before performing processes such as forming the encapsulant 29b, 29b', 29b''', the present invention prevents the positioning accuracy of the semiconductor component 28 from being adversely affected by the CTE of the encapsulant 29b, 29b', 29b''' and eliminates the thermal effect of an RDL process on the semiconductor component 28 as in the prior art. Therefore, an increase in the size of the carrier 20 does not result in an increase in the position error of the semiconductor components 28, thereby facilitating accurate control of the position of the semiconductor components 28. For example, for a semiconductor component 28 having an electrode pad pitch of 40 um, its position can be accurately aligned in a 12-inch wafer (carrier 20) without being adversely affected by the CTE and flexibility of a thermal release tape, thus improving the product yield and saving the cost.

Further, the present invention can detect the yield rate of the circuit layer 24 before mounting the semiconductor component 28. If the circuit layer 24 is detected to be of low quality, the structure is directly discarded without performing subsequent processes such as mounting the semiconductor component 28. Therefore, the present invention does not discard good semiconductor components as in the prior art when the circuit layer is detected to be of low quality, thereby saving material costs and achieving cost efficiency.

Furthermore, since the surface of the carrier 20 is conductive, after the circuit layer 27 and the conductive bumps 27 are formed, an electrical test can be performed (without the need to electrically connect another electronic device) to detect the yield rate of the circuit layer. As such, subsequent processes such as mounting semiconductor components are performed only when the circuit layer is detected to be of high quality, thereby improving the product yield and saving the fabrication time.

According to the present invention, the conductive portions of a semiconductor component are aligned to the corresponding conductive bumps, respectively, and an encapsulant is formed to encapsulant the semiconductor component, and then the carrier is removed so as to prevent the positioning accuracy of the semiconductor component from being adversely affected by a thermal release tape as in the prior art, thereby improving the product yield and saving the fabrication cost.

In addition, the present invention can detect the yield rate of the circuit layer before mounting semiconductor components so as to avoid discarding good semiconductor components as in the prior art, thereby saving the fabrication cost and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a wafer level packaging substrate, comprising the steps of:
    forming a first dielectric layer on a carrier, the first dielectric layer having a plurality of first openings for exposing portions of the carrier, wherein the carrier is a silicon wafer;
    after forming the first dielectric layer on the carrier, forming a first metal layer on a surface of the first dielectric layer, a portion of the first metal layer being formed in the first openings of the first dielectric layer, wherein a material of the first metal layer is different from a material of the carrier;
    forming a circuit layer on the first metal layer, a portion of the circuit layer being formed in the first openings of the first metal layer;
    forming a second dielectric layer on the first dielectric layer and the circuit layer, the second dielectric layer having a plurality of second openings for exposing portions of the circuit layer;
    forming a plurality of conductive bumps on the exposed portions of the circuit layer in the second openings and electrically connected to the circuit layer; and
    after forming the plurality of conductive bumps, removing the carrier to expose the first metal layer under the circuit layer,
    wherein a surface of the first metal layer is flush with the surface of the first dielectric layer.

2. The method of claim 1, wherein the carrier has an aluminum layer disposed thereon.

3. The method of claim 1, wherein forming the circuit layer comprises the steps of:
    forming a resist layer on the first metal layer and forming a plurality of openings in the resist layer for exposing portions of the first metal layer;
    forming the circuit layer on the exposed portions of the first metal layer in the openings of the resist layer; and
    removing the resist layer and the first metal layer under the resist layer.

4. The method of claim 1, wherein forming the conductive bumps comprises the steps of:
    forming a second metal layer on a surface of the second dielectric layer, a portion of the second metal layer being formed in a plurality of second openings of the second dielectric layer;
    forming a resist layer on the second metal layer and forming a plurality of openings in the resist layer for exposing portions of the second metal layer;
    forming the conductive bumps on the exposed portions of the second metal layer in the openings of the resist layer; and
    removing the resist layer and a portion of the second metal layer under the resist layer.

5. The method of claim 1, wherein the carrier is removed through a grinding process or an etching process.

6. The method of claim 1, after removing the carrier, further comprising forming conductive elements on the first metal layer under the circuit layer.

7. The method of claim 1, after forming the circuit layer, further comprising forming a redistribution layer on the first dielectric layer, and forming the second dielectric layer on the redistribution layer, wherein the redistribution layer electrically connects the conductive bumps and the circuit layer.

8. A fabrication method of a wafer level semiconductor package, comprising the steps of:
    providing a carrier for carrying a packaging substrate, wherein the carrier is a silicon wafer, the packaging substrate comprises a first dielectric layer formed on the carrier, a first metal layer formed on a surface of the first dielectric layer, a circuit layer formed on the first metal layer, a second dielectric layer formed on the first dielectric layer, and a plurality of conductive bumps disposed on the second dielectric layer and electrically connected to the circuit layer, wherein a material of the first metal layer is different from a material of the carrier;
    mounting a semiconductor component on the packaging substrate and electrically connecting the semiconductor component to the conductive bumps, wherein the semiconductor component has an active surface and an inactive surface opposite to the active surface;
    forming an encapsulant on the second dielectric layer for encapsulating the semiconductor component; and
    after forming the encapsulant on the second dielectric layer, removing the carrier to expose the first metal layer under the circuit layer,
    wherein a surface of the first metal layer is flush with the surface of the first dielectric layer.

9. The method of claim 8, wherein the carrier has an aluminum layer formed thereon.

10. The method of claim 8, wherein fabrication of the circuit layer comprises the steps of:
    forming the first metal layer on the first dielectric layer, a portion of the first metal layer being formed in a plurality of first openings of the first dielectric layer;
    forming a resist layer on the first metal layer and forming a plurality of openings in the resist layer for exposing portions of the first metal layer;
    forming the circuit layer on the exposed portions of the first metal layer in the openings of the resist layer; and removing the resist layer and the first metal layer under the resist layer.

11. The method of claim 8, wherein fabrication of the conductive bumps comprises the steps of:
- forming a second metal layer on a surface of the second dielectric layer, a portion of the second metal layer being formed in a plurality of second openings of the second dielectric layer;
- forming a resist layer on the second metal layer and forming a plurality of openings in the resist layer for exposing portions of the second metal layer;
- forming the conductive bumps on the exposed portions of the second metal layer in the openings of the resist layer; and
- removing the resist layer and the second metal layer under the resist layer.

12. The method of claim 8, wherein the packaging substrate further comprises a redistribution layer formed between the first dielectric layer and the second dielectric layer for electrically connecting the circuit layer and the conductive bumps.

13. The method of claim 8, wherein the active surface of the semiconductor component has a plurality of conductive portions, the conductive portions electrically connected to the conductive bumps by a solder material or an adhesive material.

14. The method of claim 8, wherein the semiconductor component is a single chip or a chip stack structure.

15. The method of claim 8, further comprising grinding the encapsulant.

16. The method of claim 15, wherein the inactive surface of the semiconductor component is exposed from the encapsulant.

17. The method of claim 8, before forming the encapsulant, further comprising forming an underfill between the semiconductor component and the second dielectric layer.

18. The method of claim 8, wherein the carrier is removed through a grinding process or an etching process.

19. The method of claim 8, after removing the carrier, further comprising forming conductive elements on the circuit layer.

20. The method of claim 8, after removing the carrier, further comprising performing a singulation process.

* * * * *